(12) United States Patent
Popescu et al.

(10) Patent No.: US 7,023,075 B2
(45) Date of Patent: Apr. 4, 2006

(54) TEARDROP SHAPED LEAD FRAMES

(75) Inventors: Eugen Popescu, Santee, CA (US);
Herbert Otto Fredrickson, Chula Vista, CA (US)

(73) Assignee: Crydom Technologies, George Town (KY)

( * ) Notice: Subject to any disclaimer, the term of this patent is extended or adjusted under 35 U.S.C. 154(b) by 161 days.

(21) Appl. No.: 10/702,693

(22) Filed: Nov. 6, 2003

(65) Prior Publication Data

US 2005/0098858 A1    May 12, 2005

(51) Int. Cl.
*H01L 23/495* (2006.01)
(52) U.S. Cl. ............ 257/676; 257/666; 257/669; 257/670; 257/674
(58) Field of Classification Search ........ 257/666, 257/667, 668, 669, 670, 674, 676
See application file for complete search history.

(56) References Cited

U.S. PATENT DOCUMENTS 6,218,630 B1 *   4/2001   Takigami ............ 174/261
6,281,567 B1 *   8/2001   Murayama et al. ......... 257/676
2005/0046023 A1 * 3/2005   Takahashi et al. .......... 257/734

FOREIGN PATENT DOCUMENTS

JP        2003-243569     *   8/2003   .......... 23/12

* cited by examiner

*Primary Examiner*—Nathan J. Flynn
*Assistant Examiner*—Victor A. Mandala, Jr.
(74) *Attorney, Agent, or Firm*—Gibson, Dunn & Crutcher LLP; Stanley J. Gradisar

(57) ABSTRACT

A lead frame for use in solid state relays has a teardrop shaped frame. The frame has a small rounded portion connected to a large rounded portion. A power semiconductor is mounted in the large rounded portion. The teardrop shape eliminates sharp corners found in rectangular frames and allows heat to dissipate radially in all directions. More metal in close proximity to the power semiconductor, maintaining a lower aspect ratio of length to width, allows the semiconductor to run cooler at any given load. Several vent holes are located in the small rounded portion, which act as exhaust ports for the fumes generated in the heating stage of the solder re-flow, increasing solder coverage and improving reliability. The life of solder junctions utilizing the teardrop shaped lead frame which are subjected to temperature cycling while under load is increased, thus extending the life of the solid state relay.

29 Claims, 3 Drawing Sheets

TEARDROP SHAPED LEAD FRAMES

FIELD OF THE INVENTION

This invention relates to solder connections, and more particularly, to a teardrop shaped lead frame soldered to a substrate typically found in solid state relays.

BACKGROUND OF THE INVENTION

A common construction technique for a solid state relay with power semiconductors is to solder the semiconductors on two pieces of rectangular metal (lead frame), typically made of copper, which are soldered to a single piece of ceramic, typically aluminum oxide (alumina). Typically, the metal is long and narrow—usually the width closely coincides with the width of the semiconductor chip. The ceramic is then attached to a base plate, typically aluminum. The solder connection between the lead frame and the alumina substrate is subject to failure through cracks and separations during temperature cycling while under load. The present invention increases the life of such solder junctions subjected to temperature cycling while under load.

DETAILED DESCRIPTION OF THE INVENTION

Figure 1:
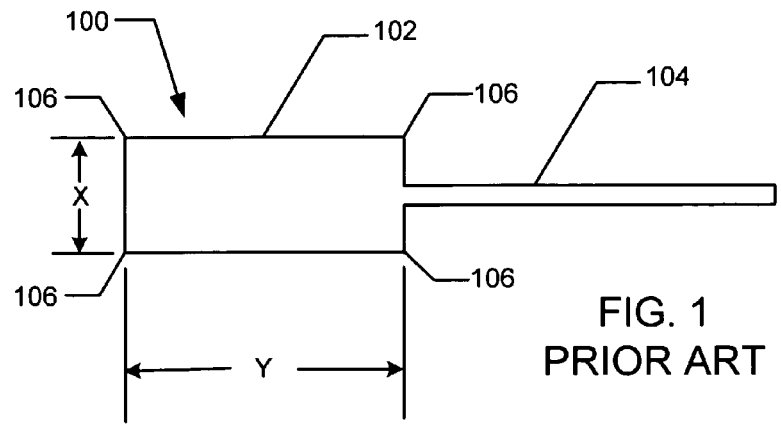
FIG. 1 shows a diagram of a typical rectangular lead frame of the prior art.

Referring now to the Figures, in which like reference numerals refer to structurally and/or functionally similar elements thereof, FIG. 1 shows a diagram of a typical rectangular lead frame of the prior art. Referring now to FIG. 1, Lead Frame 100, typically made of copper, has Rectangular Frame 102 and Lead 104. Rectangular Frame 102 has width X and length Y that is determined by the particular application for the solid state relay to be manufactured. Two such Lead Frames 100 are used in an assembly shown in FIG. 2.

Figure 2:
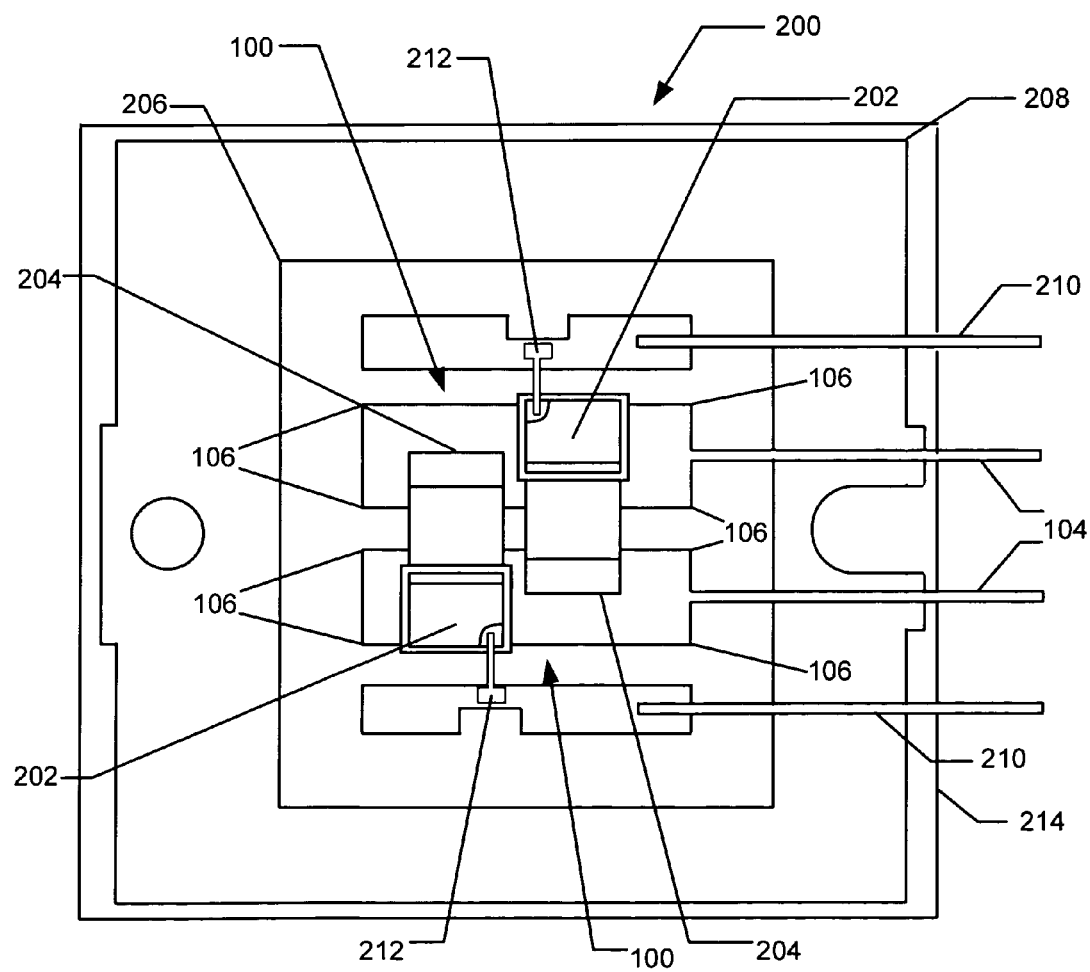
FIG. 2 shows a diagram of the typical construction of an assembly having rectangular lead frames for a solid state relay of the prior art.

FIG. 2 shows a diagram of the typical construction of an assembly having rectangular lead frames for a solid state relay of the prior art. Referring now to FIG. 2, Assembly 200 has two Lead Frames 100 soldered to Substrate 206, typically an aluminum oxide (alumina). Substrate 206 is attached to Base Plate 208, which is typically made of aluminum. Base Plate 208 is typically attached to Heat Sink Sub-Assembly 214. One Power Semiconductor 202 is soldered to each Lead Frame 100. Each Power Semiconductor 202 has a Cathode Connector 204. Gate Jumpers 212 are connected to Gate Lead Wires 210.

When Power Semiconductors 202 are conducting, they generate heat. The heat is mainly dissipated by Rectangular Frame 102, Substrate 206, and Base Plate 208. The heat from Power Semiconductors 202 cause expansion and contraction of the entire Assembly 200 as the solid state relay is turned on and off (temperature cycled). The resulting expansion and contraction of Assembly 200, in conjunction with the different rates of thermal expansion of Rectangular Frame 102 and Substrate 206, and of Substrate 206 and Base Plate 208, will in time cause degradation of the solder junctions. The most common failure will be a separation or crack starting at or near Corners 106 of the solder junction is between Lead Frames 100 and the Substrate 206.

The size and shape of Lead Frame 100 is a major factor in determining the life of this solder junction. The greater the area of Lead Frame 100, the greater its capacity to dissipate the heat generated by Power Semiconductor 202. When a lead frame has a rectangular shaped frame, such as Rectangular Frame 102 of Lead Frame 100, where the width closely matches that of the semiconductor, such as Power Semiconductor 202 typical of the prior art, the heat is mainly dissipated bilaterally along length Y of Rectangular Frame 102. The greater the aspect ratio of length Y to width X of Rectangular Frame 102, the more unequal are the stresses caused by the miss-match of the thermal expansion properties of the various materials used in the construction of Assembly 200 for the solid state relay.

Figure 3:
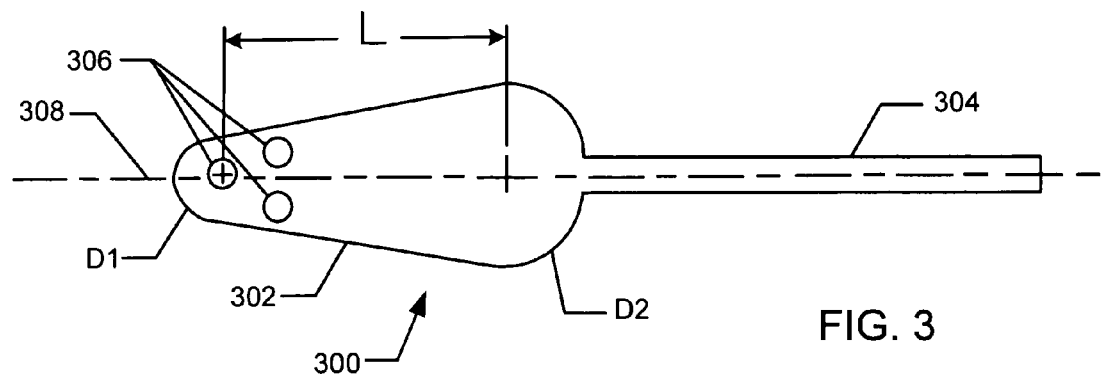
FIG. 3 shows a diagram of a teardrop shaped lead frame in an embodiment of the present invention.

FIG. 3 shows a diagram of a teardrop shaped lead frame in an embodiment of the present invention. Referring now to FIG. 3, Lead Frame 300 is typically made of copper, but any metal with a solderable surface, or any metal with a plated solderable surface, such as nickel-plated aluminum, may be used. Lead Frame 300 has Teardrop Frame 302 and Lead 304 which extends along Centerline 308 of Teardrop Frame 302. Teardrop Frame 302 has an arc with a first diameter D1 at a small end portion, an arc with a second diameter D2 at a large end portion, and a middle portion there between having a length L and a width that increases from D1 at the small end portion to D2 at the large end portion. D1, D2, and L are determined by the particular application for the solid state relay to be manufactured. Teardrop Frame 302 also has several Vent Holes 306 shown located in the small end portion. Vent Holes 306 may also be located in the middle portion having length L, but Vent Holes 306 are typically not located in the large end portion where a power semiconductor will be placed. For Lead Frame 300 shown in FIG. 3, Lead 304 extends from the large end portion of Teardrop Frame 302. A second Lead Frame 300' is used in an assembly shown in FIG. 4 that is identical to that shown in FIG. 3 except that Lead 304 extends from the small end portion of Teardrop Frame 302. Thus, a pair of Lead Frames 300, 300' are used in the assembly in which the two Leads 304 extend in the same direction.

Figure 4:
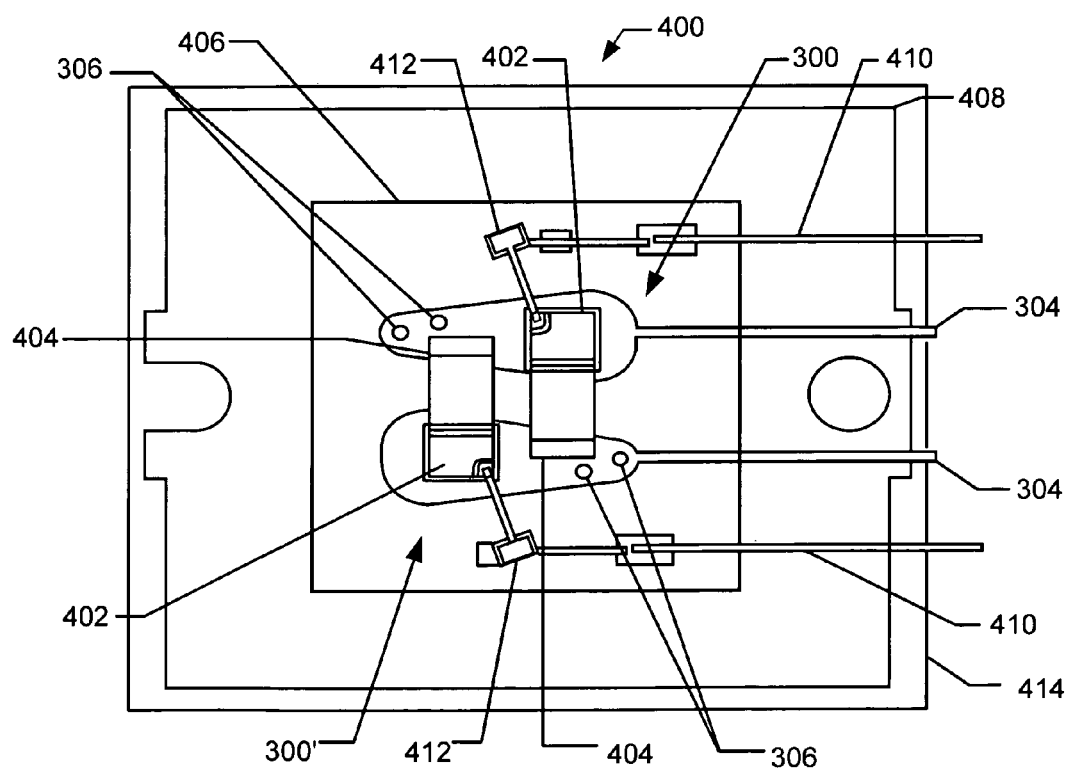
FIG. 4 shows a diagram of the construction of an assembly having teardrop shaped lead frames for a solid state relay in an embodiment of the present invention.

FIG. 4 shows a diagram of the construction of an assembly having teardrop shaped lead frames for a solid state relay in an embodiment of the present invention. Referring now to FIG. 4, Assembly 400 has two Lead Frames 300, 300' soldered to Substrate 406, typically an aluminum oxide (alumina). In some lower power applications, an epoxy or adhesive with conductive properties may be used instead of solder to attach Lead Frames 300, 300' to Substrate 406. Substrate 406 is attached to Base Plate 408, which is typically made of aluminum. Base Plate 408 is typically attached to Heat Sink Sub-Assembly 414. One Power Semiconductor 402 is soldered to each Lead Frame 300, 300'.

Each Power Semiconductor 402 has a Cathode Connector 404. Gate Jumpers 412 are connected to Gate Lead Wires 410.

The optimum shape of a lead frame for a solid state relay to minimize stress would be perfectly round, as the stresses would be equal from all directions. The stress value would be less than the value of the stress developed across the longest distance of any other shaped lead frame of equal area. However, due to space constraints in manufacturing, round is not a practical shape. In addition, the pattern utilized for deposition of the material used for the attachment of the alumina substrate to the base plate should have rounded corners so as to eliminate sharp corners where stress cracks may occur. So, the present invention strikes a compromise by using Lead Frames 300, 300' having a teardrop shaped Teardrop Frame 302, which has a shape more resembling round than rectangular, and which eliminates sharp corners found in rectangular frames. Power Semiconductors 402 are mounted near the center of the large end portion having diameter D2 of Teardrop Frame 302. The large end portion of Teardrop Frame 302 must form a larger area than Power Semiconductors 402 being attached thereto. Thus, by utilizing a teardrop shape for Teardrop Frame 302, the expected life of the solid state relay can be extended for the following reasons.

First, Teardrop Frames 302 that are larger than Power Semiconductors 402 allow the heat to dissipate radially in all directions. Compared to the same power semiconductor on a rectangular shaped lead frame, as shown in FIG. 2, whose width X matches the size of the power semiconductor, only bilateral dissipation of the heat along the length Y is possible.

Second, Teardrop shaped Teardrop Frames 302 that are larger than Power Semiconductors 402 also allow for more metal in close proximity to Power Semiconductors 402. This maintains a lower aspect ratio of length to width, allowing the semiconductor to run cooler at any given load.

Lastly, the addition of Vent Holes 306 to Teardrop Frame 302 brings additional benefits to the present invention. Vent Holes 306 act as exhaust ports for the fumes generated in the heating stage of the solder re-flow. During re-flow, the flux residue trapped between Teardrop Frame 302 of Lead Frames 300, 300' and the solder alloy will tend to use Vent Holes 306 to escape, leading to an increase in solder coverage, and thus improved reliability, especially in the case of a large area lead frame. Vent Holes 306 also decrease the rigidity of Lead Frames 300, 300', which in return improves reliability by decreasing the stress on the solder joint during thermal expansion and contraction.

Figure 5:
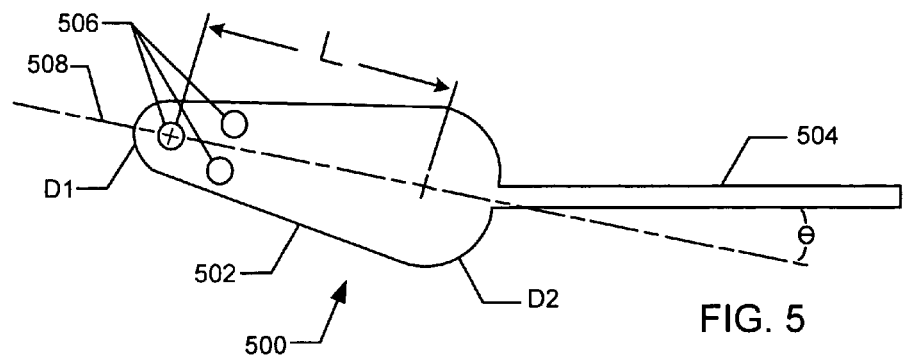
FIG. 5 shows a diagram of a teardrop shaped lead frame in another embodiment of the present invention.
Figure 6:
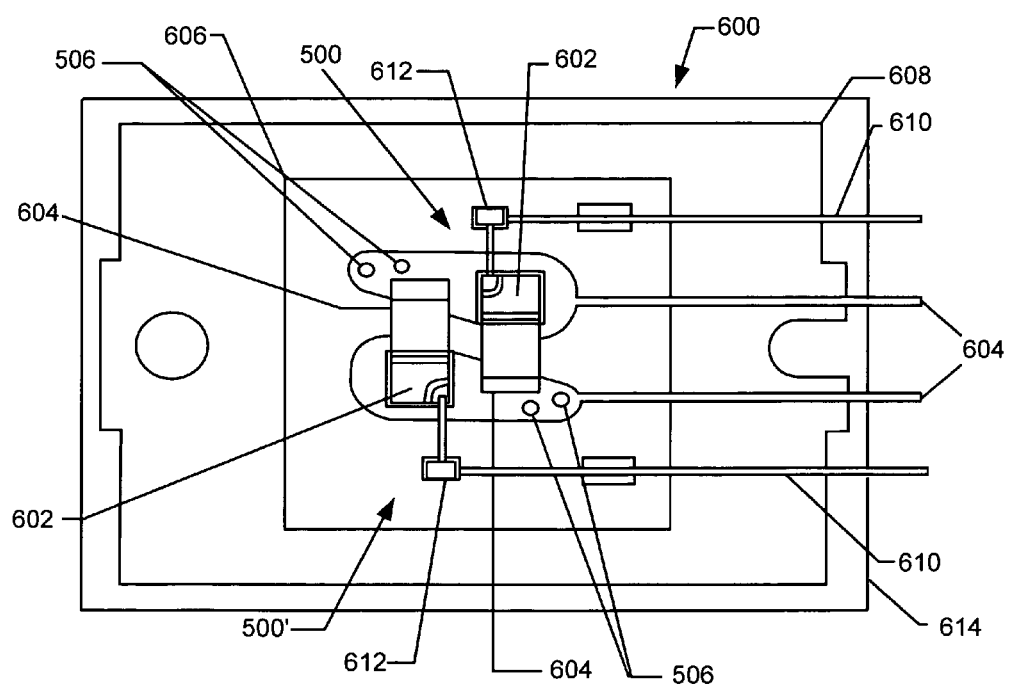
FIG. 6 shows a diagram of the construction of an assembly having teardrop shaped lead frames for a solid state relay in another embodiment of the present invention.

FIG. 5 shows a diagram of a teardrop shaped lead frame in another embodiment of the present invention. Referring now to FIG. 5, Lead Frame 500 is similar to Lead Frame 300 except that Lead 504 extends at an Angle θ to Centerline 508 of Teardrop Frame 502. The angle is imparted to Lead 504 to accommodate more efficient placement of a pair of Lead Frames 500, 500' on a Substrate 606 as shown in FIG. 6. Angle θ may typically range between about 10° and 15° for most typical SSR applications. One skilled in the art will recognize that a particular application may require or lend itself to an angle θ that may fall below or above this range to meet the specific geometries of the SSR contemplated, and such applications are within the scope of this invention.

Teardrop Frame 502 has an arc with a first diameter D1 at a small end portion, an arc with a second diameter D2 at a large end portion, and a middle portion there between having a length L and a width that increases from D1 at the small end portion to D2 at the large end portion. D1, D2, and L are determined by the particular application for the solid state relay to be manufactured. Teardrop Frame 502 also has several Vent Holes 506 located in the small end portion. For the Lead Frame 500 shown in FIG. 5, Lead 504 extends from the large end portion of Teardrop Frame 502. A second Lead Frame 500' is used in an assembly shown in FIG. 6 that is identical to that shown in FIG. 5 except that Lead 504 extends from the small end portion of Teardrop Frame 502. Thus, a pair of Lead Frames 500, 500' are used in the assembly. One skilled in the art will recognize that many other similar variations to that of Lead Frame 300 and Lead Frame 500 shown are possible and within the scope of the present invention.

FIG. 6 shows a diagram of the construction of an assembly having teardrop shaped lead frames for a solid state relay in another embodiment of the present invention. Referring now to FIG. 6, Assembly 600 is similar to Assembly 400, but instead has two Lead Frames 500, 500'. The descriptions in FIG. 4 of Power Semiconductor 402, Cathode Connector 404, Substrate 406, Base Plate 408, Gate Lead Wire 410, Gate Jumper 412, and Heat Sink Sub-Assembly 414 are comparable and apply to Power Semiconductor 602, Cathode Connector 604, Substrate 606, Base Plate 608, Gate Lead Wire 610, Gate Jumper 612, and Heat Sink Sub-Assembly 614.

Testing was performed to verify the improved performance of the present invention over traditional construction and design. Two different tests were conducted to evaluate the thermal fatigue resistance of the present invention compared to conventional and other assemblies. In Test One, four conventional units, called Group One Units, were constructed with standard rectangular lead frames. The Heat Sink Sub-Assemblies (HSSA) each had direct bonded copper (DBC) substrates and utilized 10Sn/88Pb/2Ag solder, except for the ceramic base plate, which utilized 60Sn/40Pb solder. These four Units Under Test (UUT) were designated as UUT #1, UUT #2, UUT #3, and UUT #4.

Four units with the teardrop shaped lead frame of the present invention, called Group Two Units, were also constructed. The HSSA and the ceramic base plate were both soldered with 60Sn/40Pb solder, which is the preferred construction of the present invention. Other solders that could be used include 63Sn/37Pb and 62Sn/36Pb/2Ag, but 60Sn/40Pb is preferred. These four Units Under Test were designated as UUT #5, UUT #6, UUT #7, and UUT #8. All eight Group One Units and Group Two Units were potted with RTV silicone and rated at 40 Amperes. Temperatures were monitored with thermocouples on the cathode jumpers and in the center of the base plates.

In Test Two, four hybrid units, called Group Three Units, were constructed with standard rectangular lead frames. The HSSA and the ceramic base plate were both soldered with 60Sn/40Pb solder, which is the preferred construction of the present invention. These four Units Under Test were designated as UUT #9, UUT #10, UUT #11, and UUT #12.

Another four units of conventional design, called Group Four Units, were constructed with standard rectangular lead frames. The HSSA utilized 10Sn/88Pb/2Ag solder, and the ceramic base plate attachment utilized 60Sn/40Pb solder. These four Units Under Test were designated as UUT #1, UUT #14, UUT #15, and UUT #16. All eight Group Three Units and Group Four Units were also potted with RTV silicone and rated at 40 Amperes. Temperatures were also monitored with thermocouples on the cathode jumpers and in the center of the base plates.

All eight Group One Units and Group Two Units in Test One, and all eight Group Three Units and Group Four Units in Test Two, had all outputs connected in series, with no external heat sink attached. An electric current was used to heat up the Eight units in each test to 125° C. and then cooled by forced air with fans down to 40° C. All eight units in each test were temperature cycled for one to two hours to allow them to stabilize between the high temperature of 125° C. and the low temperature of 40° C. After this stabilization period, the setup was changed from a temperature cycle to a time cycle. One complete time cycle consists of a hot period of time where the current is turned on, which heats up the units, plus a cold period of time in which the current is turned off and forced air cooling is turned on, cooling the units down. The time cycle for both tests were conducted under the following parameters:

| Hot Period: | 99 seconds |
|---|---|
| Cold Period: | 141 seconds |
| Load Type: | Resistive |
| Load Current: | 28.0 Amperes |
| Failure: | Defined as occurring when the temperature reaches 150° C. during any cycle. |

Table One below shows the results of Test One for the Group One Units and the Group Two Units under the above parameters. Table Two below shows the results of Test Two for the Group Three Units and the Group Four Units under the above parameters.

TABLE ONE

| UUT Number | Lead Frame Type | Solder Composition HSSA Construction | Solder Composition Ceramic Base Plate | Total Cycles Before Failure |
|---|---|---|---|---|
| UUT #1 | Rectangular/DBC | 10Sn/88Pb/2Ag | 60Sn/40Pb | 6,642 |
| UUT #2 | Rectangular/DBC | 10Sn/88Pb/2Ag | 60Sn/40Pb | 6,645 |
| UUT #3 | Rectangular/DBC | 10Sn/88Pb/2Ag | 60Sn/40Pb | 6,030 |
| UUT #4 | Rectangular/DBC | 10Sn/88Pb/2Ag | 60Sn/40Pb | 8,841 |
| UUT #5 | Teardrop | 60Sn/40Pb | 60Sn/40Pb | — |
| UUT #6 | Teardrop | 60Sn/40Pb | 60Sn/40Pb | 13,006 |
| UUT #7 | Teardrop | 60Sn/40Pb | 60Sn/40Pb | 15,445 |
| UUT #8 | Teardrop | 60Sn/40Pb | 60Sn/40Pb | — |

The following observations were noted:

At 6,030 cycles, UUT #3 failed. A visual inspection revealed that a separation occurred between the cathode jumper and the cathode of one of the two SCRs on the unit.

At 6,642 cycles, UUT #1 failed. A visual inspection revealed that a separation occurred between the cathode jumper and the cathode of one of the two SCRs on the unit.

At 6,645 cycles, UUT #2 failed. A visual inspection revealed that a separation occurred between the cathode jumper and the cathode of one of the two SCRs on the unit.

At 8,841 cycles, UUT #4 failed. A visual inspection revealed that a separation occurred between the cathode jumper and the cathode of one of the two SCRs on the unit.

At 13,006 cycles, UUT #6 failed. A visual inspection revealed that a separation occurred between the cathode jumper and the cathode of one of the two SCRs on the unit.

At 15,445 cycles, UUT #7 failed. A visual inspection revealed that a separation occurred between the cathode jumper and the cathode of one of the two SCRs on the unit.

After 17,476 cycles the test was stopped. UUT #5 and UUT #8 never failed.

TABLE TWO

| UUT Number | Lead Frame Type | Solder Composition HSSA Construction | Solder Composition Ceramic Base Plate | Total Cycles Before Failure |
|---|---|---|---|---|
| UUT #9 | Rectangular | 60Sn/40Pb | 60Sn/40Pb | — |
| UUT #10 | Rectangular | 60Sn/40Pb | 60Sn/40Pb | 10,732 |
| UUT #11 | Rectangular | 60Sn/40Pb | 60Sn/40Pb | 10,755 |
| UUT #12 | Rectangular | 60Sn/40Pb | 60Sn/40Pb | — |
| UUT #13 | Rectangular | 10Sn/88Pb/2Ag | 60Sn/40Pb | 3,486 |
| UUT #14 | Rectangular | 10Sn/88Pb/2Ag | 60Sn/40Pb | 3,187 |
| UUT #15 | Rectangular | 10Sn/88Pb/2Ag | 60Sn/40Pb | 3,039 |
| UUT #16 | Rectangular | 10Sn/88Pb/2Ag | 60Sn/40Pb | 2,481 |

The following observations were noted:

At 2,481 cycles, UUT #16 failed. A visual inspection revealed that a separation occurred between the cathode jumper and the cathode of one of the two SCRs on the unit.

At 3,039 cycles, UUT #15 failed. A visual inspection revealed that a separation occurred between the cathode jumper and the cathode of one of the two SCRs on the unit.

At 3,187 cycles, UUT #14 failed. A visual inspection revealed that a separation occurred between the cathode jumper and the cathode of one of the two SCRs on the unit.

At 3,486 cycles, UUT #13 failed. A visual inspection revealed that a separation occurred between the cathode jumper and the cathode of one of the two SCRs on the unit.

At 10,732 cycles, UUT #10 failed. A visual inspection revealed that a separation occurred between the cathode jumper and the cathode of one of the two SCRs on the unit.

At 10,755 cycles, UUT #11 failed. A visual inspection revealed that a separation occurred between the cathode jumper and the cathode of one of the two SCRs on the unit.

After 10,980 cycles the test was stopped. UUT #9 and UUT #12 never failed.

Analysis of the Test Results

Group Four Units Compared To Group One Units— Group Four units are standard rectangular lead frames with a standard assembly that utilizes 10Sn/88Pb/2Ag solder for the HSSA and 60Sn/40Pb solder for the ceramic base plate. Group One units are the same as Group Four units except for the direct bonded copper substrates. In comparing the results of the tests of Group One Unites to Group Four Units, the Group Four Units averaged 3,048 cycles before failure. The Group One units averaged 7,040 cycles before failure, more than double the performance of the Group Four units, and represents a 231% increase in performance. It can be concluded that the conventional assembly with the DBC substrates offers superior performance to that of a conventional assembly without DBC substrates.

Group 3 Units Compared To Group Four Units—Group Three units are standard rectangular lead frames with an assembly that utilizes 60Sn/40Pb solder for the HSSA and the ceramic base plate, which is a preferred construction of the present invention. The Group Four units as stated above averaged 3,048 cycles before failure. Regarding the Group Three units, and ascribing 10,980 cycles to UUT #9 and UUT #12 (which never failed), the Group Three units averaged a conservative 10,862 cycles before failure, more than three times the performance of the Group Four units, and represents a 356% increase in performance. It can be concluded that an assembly with the preferred use of 60Sn/40Pb solder for the HSSA and the ceramic base plate offers superior performance over a conventional assembly utilizing 10Sn/88Pb/2Ag and 60Sn/40Pb solders.

Group Two Units Compared To Group One Units—Group Two units represent the preferred embodiment of the present invention, in which teardrop shaped lead frames are used with an assembly that utilizes 60Sn/40Pb solder for the HSSA and the ceramic base plate. The Group One units as stated above averaged 7,040 cycles before failure. Regarding the Group Two units, and ascribing 17,476 cycles to UUT #5 and UUT #8 (which never failed), the Group Two units averaged a conservative 15,851 cycles before failure, more than two times the performance of the Group One units, and represents a 225% increase in performance. It can be concluded that an assembly with the teardrop shaped lead frames and the preferred use of 60Sn/40Pb solder for the HSSA and the ceramic base plate offers superior performance over the conventional assembly utilizing rectangular lead frames and direct bonded copper substrates.

Group Three Units Compared To Group Two Units— Finally, Group Three units, representing standard rectangular lead frames with an assembly that utilizes 60Sn/40Pb solder for the HSSA and the ceramic base plate, which is a preferred design of the present invention, as stated above averaged a conservative 10,862 cycles before failure. Group Two units, the preferred embodiment of the present invention, in which teardrop shaped lead frames are used with an assembly that utilizes 60Sn/40Pb solder for the HSSA and the ceramic base plate, as stated above averaged a conservative 15,851 cycles before failure, just under one-and-a-half times the performance of the Group Three units, and represents a 146% increase in performance. It can be concluded that the use of the 60Sn/40Pb solder for the HSSA and the ceramic base plate alone cannot account for the overall improvement in performance. The teardrop shaped lead frames are also a significant factor in the increased performance of the preferred embodiment of the present invention.

Having described the present invention, it will be understood by those skilled in the art that many changes in construction and circuitry and widely differing embodiments and applications of the invention will suggest themselves without departing from the scope of the present invention.

What is claimed is:

1. A method for making a lead frame, the method comprising the steps of:
    (a) forming a small end portion of a frame having a first diameter;
    (b) forming a large end portion of said frame having a second diameter, wherein said second diameter is greater than said first diameter;
    (c) forming a middle portion of said frame having a length connecting said small end portion to said large end portion, and having a width that increases from said first diameter at said small end portion to said second diameter at said large end portion; and
    (d) forming a lead extending from at least a one of said small end portion and said large end portion of said frame and extending said lead from said frame at an angle from a centerline of said frame, wherein said angle is in a range between about 10° and 15°.

2. A method according to claim 1 further comprising:
    forming said lead frame wherein said small end portion having said first diameter, said large end portion having said second diameter, and said middle portion having said length and said increasing width impart a teardrop shape to said frame, eliminating sharp corners where stress cracks may occur over time after said lead frame is soldered to a substrate and then subjected to temperature cycling while under load.

3. A method for making a lead frame, the method comprising the steps of:
    (a) forming a small end portion of a frame having a first diameter;
    (b) forming a large end portion of said frame having a second diameter, wherein said second diameter is greater than said first diameter;
    (c) forming a middle portion of said frame having a length connecting said small end portion to said large end portion, and having a width that increases from said first diameter at said small end portion to said second diameter at said large end portion;
    (d) forming a first lead frame according to steps (a) through (c) with a first lead extending from a small end portion of said first lead frame;
    (e) forming a second lead frame according to steps (a) through (c) with a second lead extending from a large end portion of said second lead frame; and
    soldering said first lead frame and said second lead frame adjacent to each other on a substrate with said first and second leads extending in a same direction for use in a solid state relay.

4. A method according to claim 3 wherein said forming steps (d) and (e) further comprise the steps of:
    (d1) extending said first lead from said small end portion of said first lead frame along a centerline of said first lead frame; and
    (e1) extending said second lead from said large end portion of said second lead frame along a centerline of said second lead frame.

5. A method according to claim 3 wherein said forming steps (d) and (e) further comprise the steps of:
    (d1) extending said first lead from said small end portion of said first lead frame at an angle from a centerline of said first lead frame, wherein said angle is in a range between about 10° and 15°; and
    (e1) extending said second lead from said large end portion of said second lead frame at an angle from a centerline of said second lead frame, wherein said angle is in a range between about 10° and 15°.

6. A method for making a lead frame, the method comprising the steps of:
    (a) forming a small end portion of a frame having a first diameter;
    (b) forming a large end portion of said frame having a second diameter, wherein said second diameter is greater than said first diameter;
    (c) forming a middle portion of said frame having a length connecting said small end portion to said large end portion, and having a width that increases from said first diameter at said small end portion to said second diameter at said large end portion;
    (d) forming a lead extending from at least a one of said small end portion and said large end portion of said frame; and
    (e) forming at least one vent hole in at least a one of said small end portion and said middle portion of said frame;
    wherein said at least one vent hole allows fumes and flux residue generated in a heating stage of solder re-flow to escape, allowing an increase in solder coverage and decreasing a rigidity of said frame.

7. A method according to claim 6 wherein said forming step (d) further comprises the step of:
    extending said lead from said frame along a one of:
    a centerline of said frame; and at an angle from a centerline of said frame, wherein said angle is in a range between about 10° and 15°.

8. A method for making a lead frame, the method comprising the steps of:
   (a) forming a small end portion of a frame having a first diameter;
   (b) forming a large end portion of said frame having a second diameter, wherein said second diameter is greater than said first diameter;
   (c) forming a middle portion of said frame having a length connecting said small end portion to said large end portion, and having a width that increases from said first diameter at said small end portion to said second diameter at said large end portion; and
   (d) forming a lead extending from at least a one of said small end portion and said large end portion of said frame; and
   (e) forming said large end portion having said second diameter into an area larger than a power semiconductor to be attached thereto;
   wherein heat generated by said power semiconductor dissipates radially in all directions from said large end portion.

9. A method according to claim 8 wherein said forming step (d) further comprises the step of:
   extending said lead from said frame along a one of:
   a centerline of said frame; and
   at an angle from a centerline of said frame, wherein said angle is in a range between about 10° and 15°.

10. A lead frame comprising:
    a frame, said frame further comprising:
        a small end portion having a first diameter;
        a large end portion having a second diameter greater than said first diameter; and
        a middle portion having a length connecting said small end portion to said large end portion, and having a width that increases from said first diameter at said small end portion to said second diameter at said large end portion; and
    a lead extending from at least a one of said small end portion and said large end portion of said frame, wherein said lead extends from said frame at an angle from a centerline of said frame, wherein said angle is in a range between about 10° and 15°.

11. The lead frame according to claim 10 wherein said small end portion having said first diameter, said large end portion having said second diameter, and said middle portion having said length and said increasing width, impart a teardrop shape to said frame, eliminating sharp corners where stress cracks may occur over time after said lead frame is soldered to a substrate and then subjected to temperature cycling while under load.

12. A lead frame comprising:
    a frame, said frame further comprising:
        a small end portion having a first diameter;
        a large end portion having a second diameter greater than said first diameter; and
        a middle portion having a length connecting said small end portion to said large end portion, and having a width that increases from said first diameter at said small end portion to said second diameter at said large end portion, wherein said small end portion having said first diameter, said large end portion having said second diameter, and said middle portion having said length and said increasing width, impart a teardrop shape to said frame, eliminating sharp corners where stress cracks may occur over time after said lead frame is soldered to a substrate and then subjected to temperature cycling while under load; and
    a lead extending from at least a one of said small end portion and said large end portion of said frame, wherein a first lead frame having a first lead extending from a small end portion of a first frame and a second lead frame having a second lead extending from a large end portion of a second frame are soldered adjacent to each other on said substrate, wherein said first and second leads extend in a same direction, for use in a solid state relay.

13. The lead frame according to claim 12 wherein said first lead extends from said small end portion of said first frame along a centerline of said first lead frame, and said second lead extends from said large end portion of said second frame along a centerline of said second lead frame.

14. The lead frame according to claim 12 wherein said first lead extends from said small end portion of said first frame at an angle from a centerline of said first lead frame, wherein said angle is in a range between about 10° and 15°, and said second lead extends from said large end portion of said second frame at an angle from a centerline of said second lead frame, wherein said angle is in a range between about 10° and 15°.

15. A lead frame comprising:
    a frame, said frame further comprising:
        a small end portion having a first diameter;
        a large end portion having a second diameter greater than said first diameter; and
        a middle portion having a length connecting said small end portion to said large end portion, and having a width that increases from said first diameter at said small end portion to said second diameter at said large end portion;
    a lead extending from at least a one of said small end portion and said large end portion of said frame; and
    at least one vent hole located in at least a one of said small end portion and said middle portion of said frame;
    wherein said at least one vent hole allows fumes and flux residue generated in a heating stage of solder re-flow to escape, allowing an increase in solder coverage and decreasing a rigidity of said frame.

16. The lead frame according to claim 15 wherein said lead extends from said frame along a one of:
    a centerline of said frame; and
    at an angle from a centerline of said frame, wherein said angle is in a range between about 10° and 15°.

17. A lead frame comprising:
    a frame, said frame further comprising:
        a small end portion having a first diameter;
        a large end portion having a second diameter greater than said first diameter; and
        a middle portion having a length connecting said small end portion to said large end portion, and having a width that increases from said first diameter at said small end portion to said second diameter at said large end portion; and
    a lead extending from at least a one of said small end portion and said large end portion of said frame, wherein said large end portion having said second diameter forms an area larger than a power semiconductor to be attached thereto;
    wherein heat generated by said power semiconductor dissipates radially in all directions from said large end portion.

18. The lead frame according to claim 17 wherein said lead extends from said frame along a centerline of said frame.

19. The lead frame according to claim 17 wherein said lead extends from said frame at an angle from a centerline of said frame, wherein said angle is in a range between about 10° and 15°.

20. A solid state relay comprising:
a heat sink sub-assembly;
a base plate attached to said heat sink sub-assembly;
a substrate attached to said base plate;
a first teardrop shaped lead frame attached to said substrate;
a second teardrop shaped lead frame attached to said substrate;
a first power semiconductor attached to said first teardrop shaped lead frame; and
a second power semiconductor attached to said second teardrop shaped lead frame.

21. The solid state relay according to claim 20 further comprising:
at least a one of a solder composition of 60Sn/40Pb, 63Sn/37Pb, and 62Sn/36Pb/2Ag for attaching said base plate to said heat sink sub-assembly, and for attaching said substrate to said base plate.

22. The solid state relay according to claim 20 wherein said first teardrop shaped lead frame further comprises:
a small end portion having a first diameter;
a large end portion having a second diameter greater than said first diameter; and
a middle portion having a length connecting said small end portion to said large end portion, and having a width that increases from said first diameter at said small end portion to said second diameter at said large end portion; and
a lead extending from said small end portion.

23. The solid state relay according to claim 22 wherein said second teardrop shaped lead frame further comprises:
a small end portion having a first diameter;
a large end portion having a second diameter greater than said first diameter; and
a middle portion having a length connecting said small end portion to said large end portion, and having a width that increases from said first diameter at said small end portion to said second diameter at said large end portion; and
a lead extending from said large end portion.

24. The solid state relay according to claim 23 wherein said lead from said first teardrop shaped lead frame and said lead from said second teardrop shaped lead frame extend along a centerline of said first teardrop shaped lead frame and said second teardrop shaped lead frame respectively.

25. The solid state relay according to claim 23 wherein said lead from said first teardrop shaped lead frame and said lead from said second teardrop shaped lead frame extend at an angle from a centerline of said first teardrop shaped lead frame and said second teardrop shaped lead frame respectively, wherein said angle is in a range between about 10° and 15°.

26. The solid state relay according to claim 23 wherein said lead from said first teardrop shaped lead frame and said lead from said second teardrop shaped lead frame extend in a same direction on said substrate.

27. The solid state relay according to claim 23 wherein said first and second teardrop shaped lead frames further comprise:
at least one vent hole located in at least a one of said small end portion and said middle portion respectively in each of said first and second teardrop shaped lead frames;
wherein said at least one vent hole in each of said first and second teardrop shaped lead frames allows fumes and flux residue generated in a heating stage of solder re-flow to escape, allowing an increase in solder coverage and decreasing a rigidity of each of said first and second teardrop shaped lead frames.

28. The solid state relay according to claim 23 wherein said first power semiconductor is attached to said large end portion of said first teardrop shaped lead frame, and said second power semiconductor is attached to said large end portion of said second teardrop shaped lead frame;
wherein heat generated by said first and second power semiconductors dissipates radially in all directions from said large end portions of said first and second teardrop shaped lead frames.

29. The solid state relay according to claim 20 wherein said first and second teardrop shaped lead frames eliminate sharp corners where stress cracks may occur over time after said first and second teardrop shaped lead frames are soldered to said substrate and then subjected to temperature cycling while under load.

* * * * *